US012763770B2

(12) United States Patent
Savadi et al.

(10) Patent No.: US 12,763,770 B2
(45) Date of Patent: Oct. 13, 2026

(54) CONTROLLING INPUT/OUTPUT PAD DISCHARGE RATE IN STORAGE DEVICES

(71) Applicant: WESTERN DIGITAL TECHNOLOGIES, INC., San Jose, CA (US)

(72) Inventors: Ashish Savadi, Bangalore (IN); Tejaswini Keragodu, Bangalore (IN)

(73) Assignee: SANDISK TECHNOLOGIES, INC., Milpitas, CA (US)

(*) Notice: Subject to any disclaimer, the term of this patent is extended or adjusted under 35 U.S.C. 154(b) by 249 days.

(21) Appl. No.: 18/372,777

(22) Filed: Sep. 26, 2023

(65) Prior Publication Data

US 2025/0105843 A1 Mar. 27, 2025

(51) Int. Cl.

*H03K 19/013* (2006.01)
*H03K 19/09* (2006.01)

(52) U.S. Cl.

CPC ..... *H03K 19/0133* (2013.01); *H03K 19/0136* (2013.01); *H03K 19/09* (2013.01)

(58) Field of Classification Search

CPC . H03K 19/0133; H03K 19/0136; H03K 19/09
See application file for complete search history.

(56) References Cited

U.S. PATENT DOCUMENTS 6,208,177 B1 * 3/2001 Knoedl, Jr. ...... H03K 19/00361 327/170
8,779,805 B1 * 7/2014 Fernandez ........... H03K 17/163 327/170
8,988,118 B1 3/2015 Faucher
8,988,131 B2 * 3/2015 Sadate ................. H03K 17/284 327/394
9,306,555 B2 4/2016 Muljono
9,374,004 B2 6/2016 Mozak
10,498,317 B2 * 12/2019 Elwan .................. H03K 5/1252
2005/0195005 A1 * 9/2005 Choi .............. H03K 19/018521 327/170
2008/0106836 A1 5/2008 Benzer
2009/0206875 A1 * 8/2009 Tran ............... H03K 19/017581 326/82
2009/0289669 A1 * 11/2009 Seth ................. H03K 19/00361 327/109
2018/0138908 A1 * 5/2018 Kagaya ................ H03K 17/166
2018/0343008 A1 * 11/2018 Lee .................... H03K 19/0005
2021/0367586 A1 * 11/2021 Kim ................. H03K 19/00315
2023/0318598 A1 * 10/2023 Englekirk .......... H03K 19/0944 327/434

* cited by examiner

*Primary Examiner* — Seokjin Kim
(74) *Attorney, Agent, or Firm* — Arlene Neal; NEAL BLIBO LLC

(57) ABSTRACT

A transmitter controls the fall time on an open-drain link including multiple components. The transmitter includes an input driver to receive data and transmit the data on the open-drain link, thereby activating the open-drain link. The transmitter also includes a feedback mechanism to keep track of a pad when the open-drain link is activated and to determine when the pad reaches a predetermined amount of a supply voltage. When the pad reaches the predetermined amount of a supply voltage, the feedback mechanism triggers an appropriate main pull-down driver to control the fall time.

13 Claims, 8 Drawing Sheets

CONTROLLING INPUT/OUTPUT PAD DISCHARGE RATE IN STORAGE DEVICES

BACKGROUND

Non-volatile storage devices, such as solid-state drives (SSD) and the like, may use integrated circuit assemblies to store data persistently, typically using one or more memory devices. The storage device may use an open-drain link to achieve bi-directional communications with external devices including, for example, a host or a power management integrated circuit. Multiple devices may be simultaneously connected to the open-drain link. However, only one device may transact on the open-drain link at a time. The device transacting on the open-drain link may pull down or drive a 0 on the open-drain link (referred to herein the fall time). The configurations and number of devices connected to the open-drain link (referred to herein as the link load requirements) may vary.

With fabrication technology scaling rapidly, overall transistor delay has reduced significantly, making it difficult to control the input/output (I/O) pad fall time (also referred to herein as pad fall time) for standard communication protocols including, for example, Inter Integrated Circuit (I2C and I3C) open-drain protocols. The problem with controlling the fall time for open-drain links increases with variations in link load requirements among products. With changing load conditions, large pad load capacitance variations of, for example, 10 picofarads (pF) to 100 pF may occur. In a transistor architecture, the number of design elements required to maintain the pad fall time with large load variations may increase significantly, which may lead to higher die areas and require higher switching power.

Typical delay-based approaches in a transistor architecture for controlling the fall time may face additional challenges as open-drain links may support dual supply voltages for devices running on, for example, 3.3 volts (V) or 1.8 V. The design complexity of the transistor architecture may be further increased as technology nodes below 45 nm do not support 3.3 V I/O devices. Hence keeping the same delay in a transistor while protecting the circuits from over voltage stress may add additional cost to the transistor design. As technology scales, the transistor delay may also reduce, thereby increasing the number of delay elements that may be needed to control the pad fall time. Switching power and leakage may increase with the lower nodes since the delay elements required may increase at the fast corners. Furthermore, increasing the switching elements may increase noise which may impact the performance of other devices/integrated circuits shared with the same supply domain.

SUMMARY

In some implementations, a transmitter controls a fall time on an open-drain link including multiple components. The transmitter includes an input driver to receive data and transmit the data on the open-drain link, thereby activating the open-drain link. The transmitter also includes a feedback mechanism to keep track of a pad when the open-drain link is activated and to determine when the pad reaches a predetermined amount of a supply voltage. When the pad reaches the predetermined amount of a supply voltage, the feedback mechanism triggers an appropriate main pull-down driver to control the fall time.

In some implementations, a method is provided for controlling a fall time on an open-drain link including multiple components. The method includes transmitting data on the open-drain link through an input driver on a transmitter. The method also includes activating the open-drain link and tracking voltage of a pad on the activated open-drain line. The method further includes triggering an appropriate main pull-down driver to control the fall time when the pad reaches a predetermined amount of a supply voltage.

In some implementations, in addition to the input driver and the feedback mechanism, the transmitter includes a pre-driver to receive a trigger from the feedback mechanism and a main pull-down driver to receive the trigger from the pre-driver to trigger an appropriate leg of the main pull-down driver and control the fall time.

Figure 1:
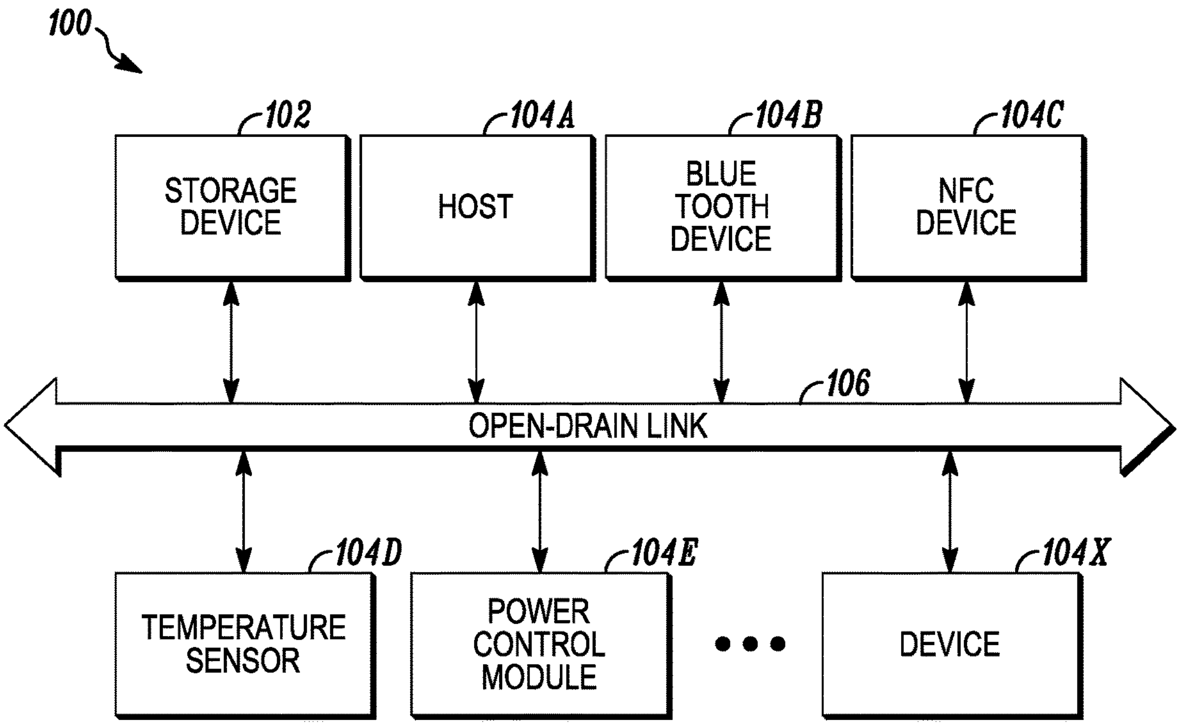
PRIOR ART FIG. 1
FIG. 1 is a schematic block diagram of an example system in accordance with some implementations.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of implementations of the present disclosure.

The apparatus and method components have been represented where appropriate by conventional symbols in the drawings, showing those specific details that are pertinent to understanding the implementations of the present disclosure so as not to obscure the disclosure with details that will be readily apparent to those of ordinary skill in the art.

DETAILED DESCRIPTION OF THE INVENTION

The following detailed description of example implementations refers to the accompanying drawings. The same reference numbers in different drawings may identify the same or similar elements.

FIG. 1 is a schematic block diagram of an example system in accordance with some implementations. System 100 includes a storage device 102 connected to multiple devices **104*a*-104*x* (referred to herein as device(s) 104) over an open-drain supply link 106. For example, storage device 102 may be connected to a host 104*a*, a blue tooth device 104*b*, a near field communications (NFC) device 104*c*, a temperature sensor 104*d*, a power control module 104*e*, etc. The number and/or configurations of devices connected to open-drain link 106 (i.e., the link load requirements) may vary. Although storage device 102 and devices 104 are simultaneously connected to open-drain link 106, only one device may transact on open-drain link 106 at a time. For example, for storage device 102 to transact on open-drain link 106, storage device 102 may generate a fall time by pulling down or driving a 0 on open-drain link 106. As indicated above FIG. 1 is provided as an example. Other examples may differ from what is described in FIG. 1**.

Figure 2:
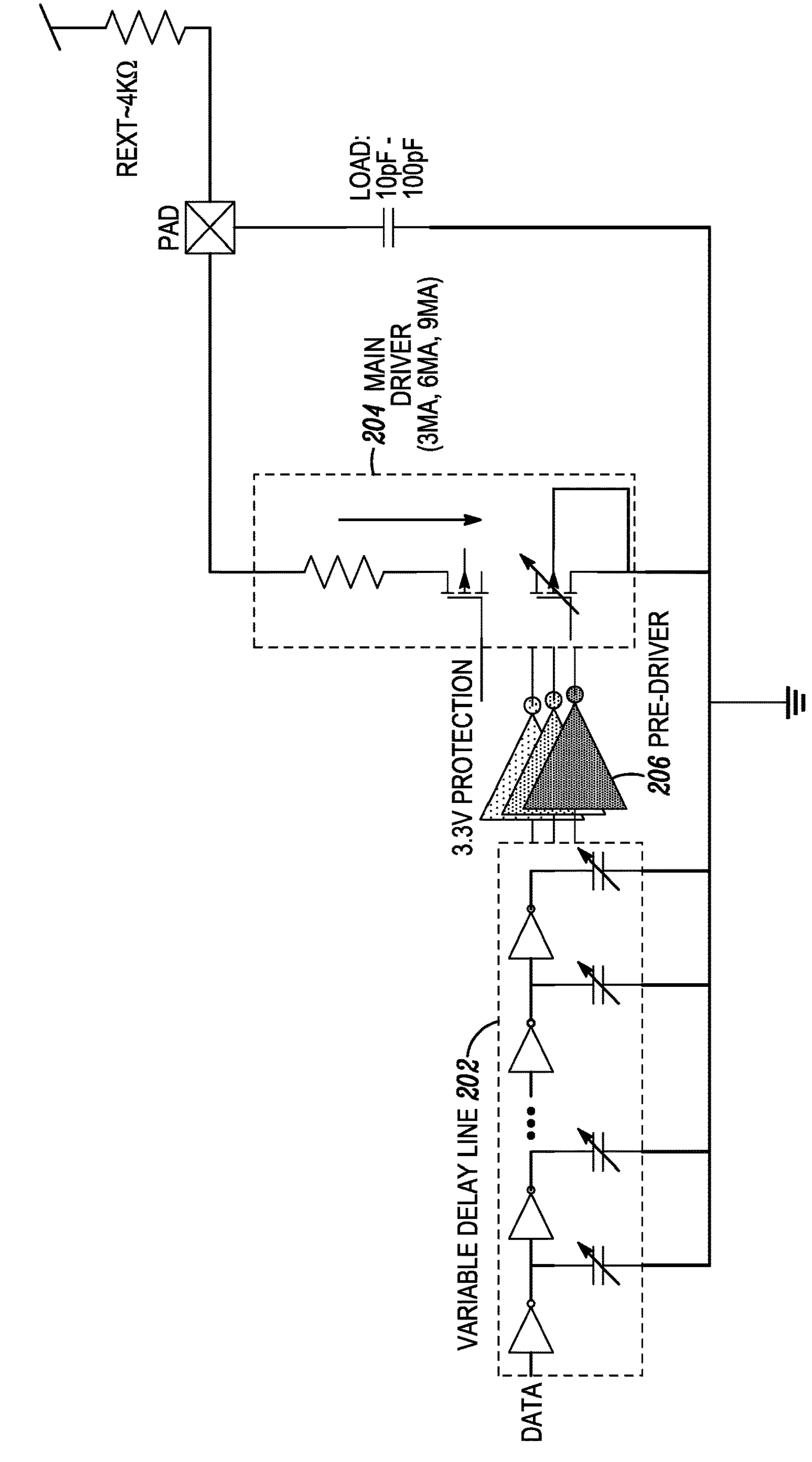
PRIOR ART FIG. 2
FIG. 2 illustrates a design of a conventional open-drain transmitter for controlling the fall time on an open-drain link.

FIG. 2 illustrates a design of a conventional open-drain transmitter for controlling the fall time on an open-drain link. The design includes a variable delay line 202, and a main pull-down driver 204 which may be a 3 milli ampere (mA) driver, 6 mA driver, or 9 mA driver. When data is transmitter from, for example, storage device 102 using the transmitter design shown in FIG. 2, the data goes through variable delay line 202 where a pre-driver 206 changes the delays of the 0s being transmitted. With the variable delay line 202 and pre-driver 206, control bits from a core sets the delay of each inverter and hence turns on pull-down driver 204 in a staggered fashion, from the lowest strength pull-down driver (i.e., the 3 mA driver) to the highest strength pull-down (i.e., the 9 mA driver). For example, with the variable delay line 202 and pre-driver 206, control bits from the core turns on the 3 mA pull-down driver first, then after a delay chain, turns on the 6 mA driver, and then after a delay chain, turns on the 9 mA driver. Using variable delay line 202 and pre-driver 206 involves implementing a large number of switching circuits to generate a delay and turn on each of pull-down drivers 204 in a staggered fashion to transmit a 0 and control the fall time.

This transmitter architecture does not automatically correct for changes in product configurations and/or load conditions. The transmitter architecture is also highly process, voltage, and temperature (PVT) dependent, hence the minimum number of delay elements (i.e., variable delay line 202) is guided by the fastest corners. As the technology improves, the same architecture that worked in, for example, 16 nanometers (nm) may not work in 7 nm or 5 nm, i.e., faster technologies, and may have to be revised to increase the number of delay elements to get the same delay and control the fall time. As such, the transmitter architecture may need to be reworked to accommodate technological improvements. Increasing resources such as the delay elements may lead to increases in the area, power, and/or cost of the transmitter. For instance, the design area and power are highly dependent on the minimum pad load, wherein the lower the pad load, the higher the area and power. Increasing the delay elements may also inject switching noise. Higher switching noise induced by the design may add additional penalties to several high-speed input/output components shared in the supply domain. For example, higher switching noise induced by the design may add additional penalties to I/O debug components requiring immunity from noise and shared in the supply domain.

Consider an example comparing the number of delay elements required where the minimum fall time in a conventional specification, such as the I2C protocol, is 6 nanoseconds (ns) (measured from 70%-30% of the supply voltage (VDDO) of, for example 1.8V or 3.3V) and the minimum load is 10 pF. If the device delay (fast corner) is around 50 peco-seconds (ps), the minimum number of delay elements required to generate the delay of 6 ns will be approximately 120, i.e., 6 ns/50 ps. As the technology improves to, for example, 7 nano meters, the minimum number of delay elements required to generate the delay will increase accordingly. Thus, there is a need for a transmitter architecture that is more immune to manufacturing process, voltage, temperature, and pad load variations, that consumes less switching power and area, and that is supply independent. For example, a transmitter architecture that may be capable of supporting both 1.8V and 3.3V supply without much impact on power. As indicated above FIG. 2 is provided as an example. Other examples may differ from what is described in FIG. 2.

Figure 3:
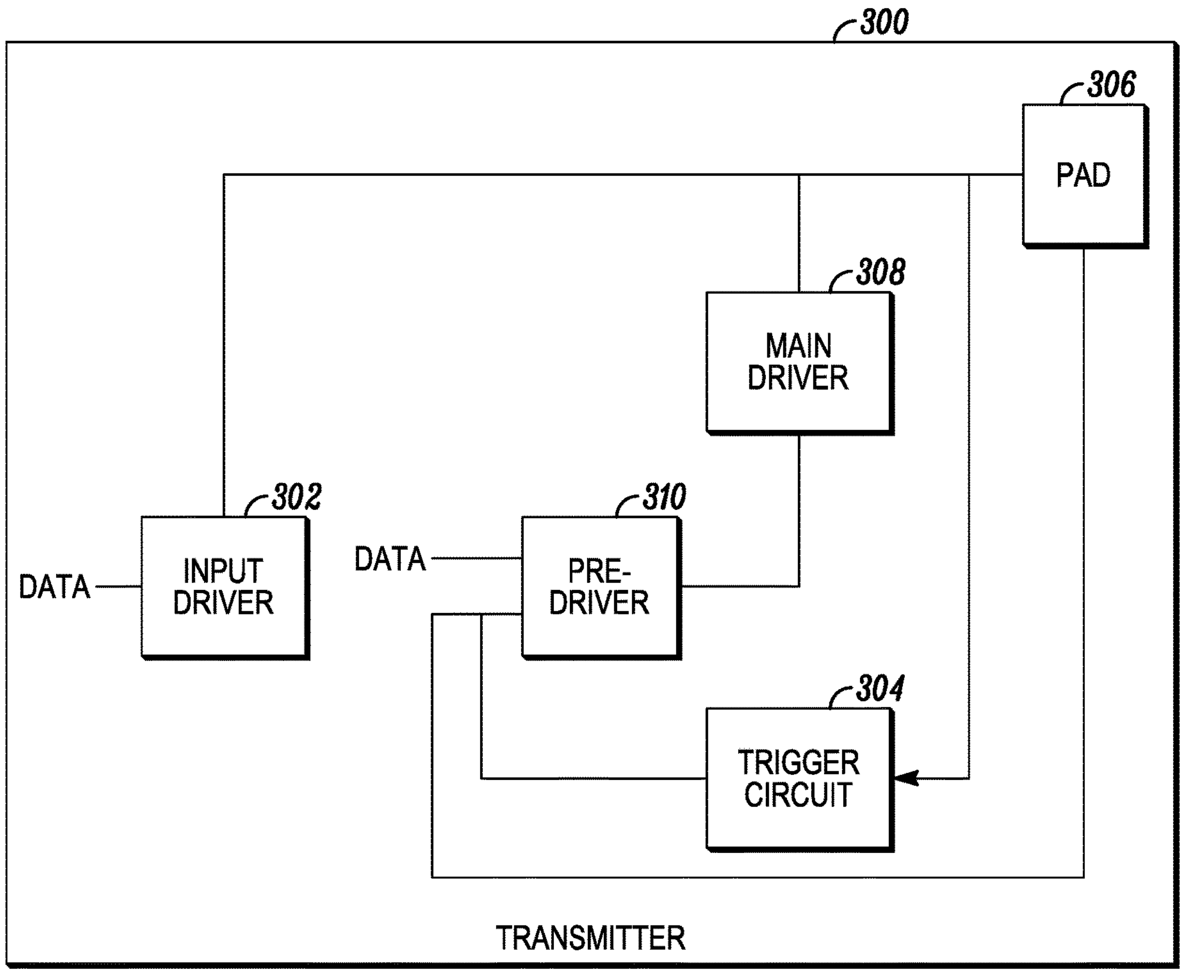
FIG. 3 is a block diagram of a supply independent, delay control transmitter for controlling the fall time on an open-drain line in accordance with some embodiments.

FIG. 3 is a block diagram of a supply independent, delay control transmitter for controlling the fall time on an open-drain link in accordance with some embodiments. When data is being transmitted through transmitter 300 the data may go through an input driver 302, which may be a 0.5 mA driver. As the data shows up on the link, the link is activated for a feedback mechanism including, for example, a Schmitt trigger circuitry 304. Circuitry 304 may use about 50 micro amp (uA) of static current. The feedback mechanism may keep tracking pad 306 and when it reaches a predetermined amount of the supply voltage, circuitry 304 may send the appropriate trigger to pre-driver 310 to trigger an appropriate main pull-down driver 308, which may be a 3 mA, 6 mA, or 9 mA driver and control the fall time. For example, when pad 306 reaches 0.4 of the supply voltage of, for example, 1.8V or 3.3V, circuitry 304 may trigger an appropriate pull-down driver 308. Transmitter 300 is thus load independent, wherein input driver 302 injects a current onto the open-drain line and circuitry 304 turns on the required current of the appropriate pull-down driver 308. As indicated above FIG. 3 is provided as an example. Other examples may differ from what is described in FIG. 3.

Figure 4:
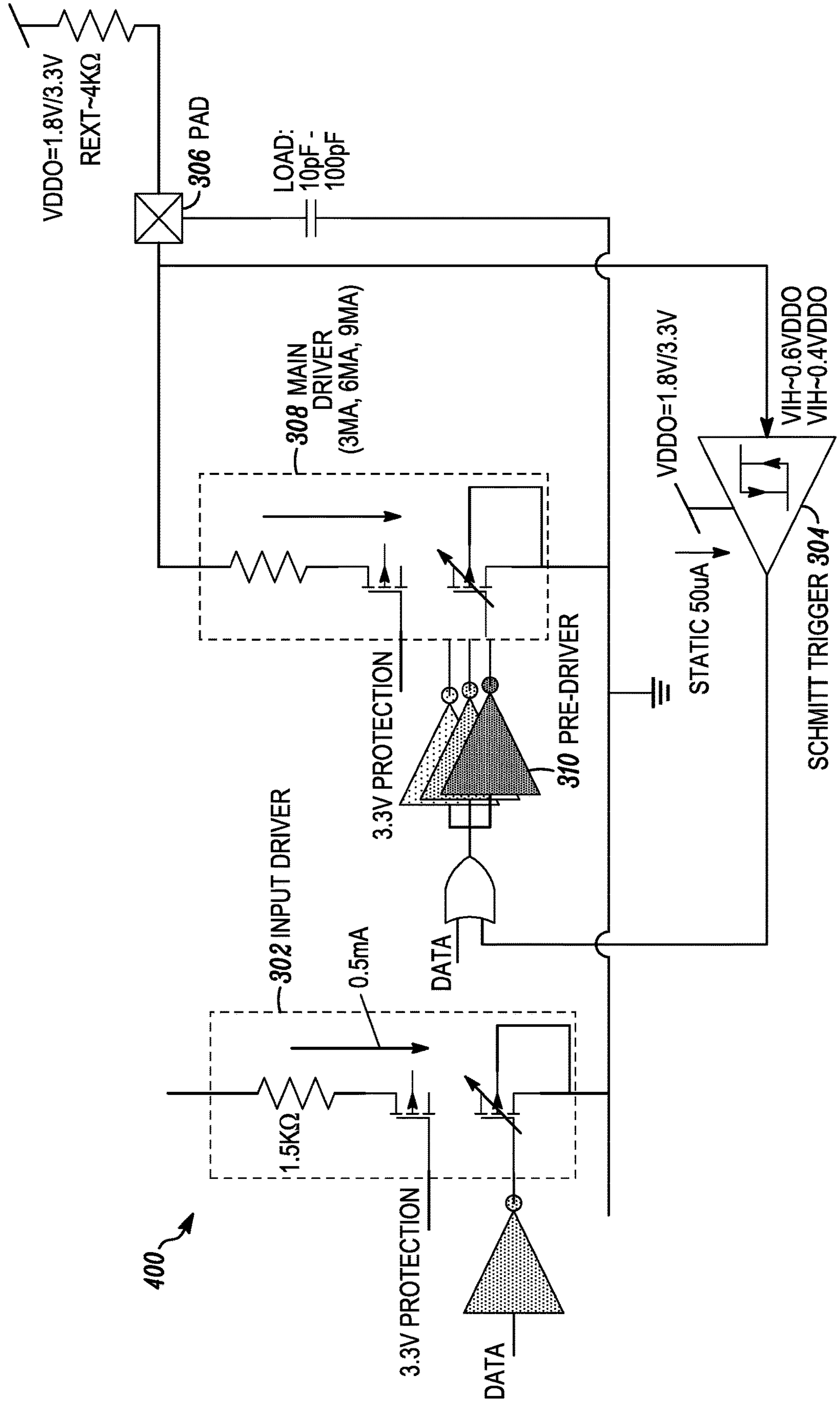
FIG. 4 further illustrates the design of the delay control transmitter for controlling the fall time in accordance with some embodiments.

FIG. 4 further illustrates the design of the delay control transmitter for controlling the fall time in accordance with some embodiments. Transmitter 400 includes a conventional main pull-down driver 308, which may be a 3 mA, 6 mA, and/or 9 mA driver, and pre-driver 310. Transmitter 400 may also include a 0.5 mA input driver 302. Initially, when input data arrives, the default 0.5 mA pull-down leg is turned on which reduces the pad voltage. Input data may be transmitted through 0.5 mA input driver 302 and when the data shows up on the link, the link may be activated for a receiver feedback path. An internal receiver on the receiver feedback path may be, for example, a low power (for example, 50 uA) Schmitt trigger 304, which senses pad 306 and on detecting the voltage drop to, for example, 0.4 VDDO of the supply voltage of 1.8V or 3.3V, activates the configurable high strength (3 mA/6 mA/9 mA) driver legs to match driver 308, thereby enabling linear discharge. The architecture of transmitter 400 is independent of supply voltage as the 3.3V protection voltage scales to ~0.55*VDDO and as a result, the driver characteristics do not change with higher supplies. Further, such an approach also solves the problem of switching noise introduced by the inverters in the variable delay line. Pad 402 is discharged through a linear resistor 302 instead of a variable delay line and as shown the linear resistor may be a 1.5 KΩ poly resistor.

Transmitter 400 is load independent wherein input driver 302 injects a current on the line and receiver 304 turns on the required current, as defined by conventional standards such as I2C, to control the fall time. Since most of the initial drive impedance is due to 1.5 KΩ poly resistor 302 (with PVT variation ~±17%), the fall time between 0.7 VDDO-0.3 VDDO which is approximated 0.7*RC may be highly controlled, where the VDDO may be 1.8V or 3.3V and the I2C fall time specification is 6 ns-120 ns defined between 0.7*VDDO to 0.3*VDDO. The typical fall time using the design as shown in FIG. 4 may be 10.5 ns, i.e., 0.7*1.5 KΩ*10 pF. The minimum fall time with −17% variation in the poly resistor may be 8.7 ns, i.e., 0.7*0.83*1.5 KΩ*10 pF.

The architecture of transmitter 400 may work in both 1.8V and 3.3V modes, targeting stress free operations without additional area penalties. The area required for the long delay chain may be saved and the architecture of transmitter 400 may use the existing main driver and pre driver as defined in conventional delay specifications. The architecture of transmitter 400 also removes the switching noise injected into the supply domain by the delay chain. The architecture is technology independent and can be scaled to other technologies without much reworking of the design. As indicated above FIG. 4 is provided as an example. Other examples may differ from what is described in FIG. 4.

Figure 5:
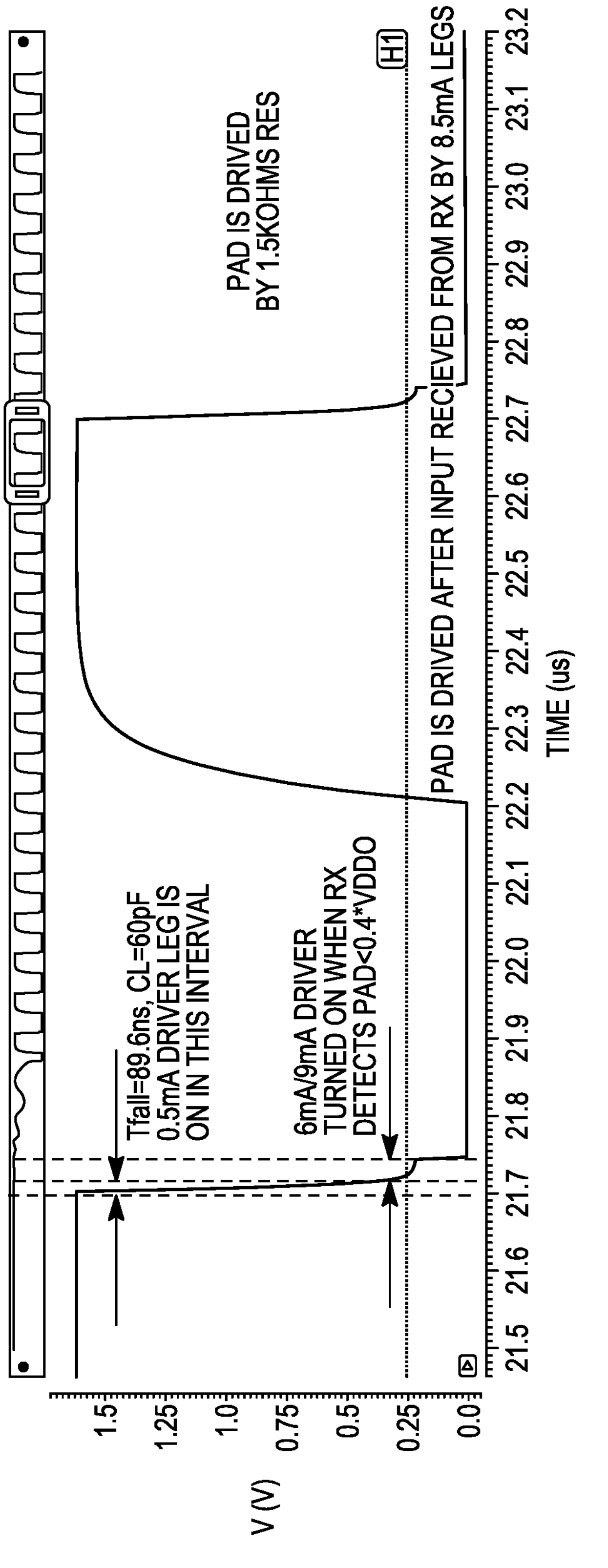
FIG. 5 is a diagram of example components of the storage device of FIG. 1.

FIG. 5 shows an example of simulation results at 1.8V covering a pad fall time in accordance with some embodiments. The pad may be driven by a 1.5 Kohms resistor. The fall time may be 89.6 ns for a load of 60 pf, wherein 0.5 mA input driver 302 is on. The right amount of drive strength may be activated only when the pad voltage reaches a certain point. FIG. 5 shows the voltage of the pad falling and when internal receiver 304 detects that the pad voltage is at 0.4 of the supply voltage, as shown by the bottom arrows, the appropriate driver strength is activated to pull down the bus for a sharp fall. As indicated above FIG. 5 is provided as an example. Other examples may differ from what is described in FIG. 5.

Figure 6:
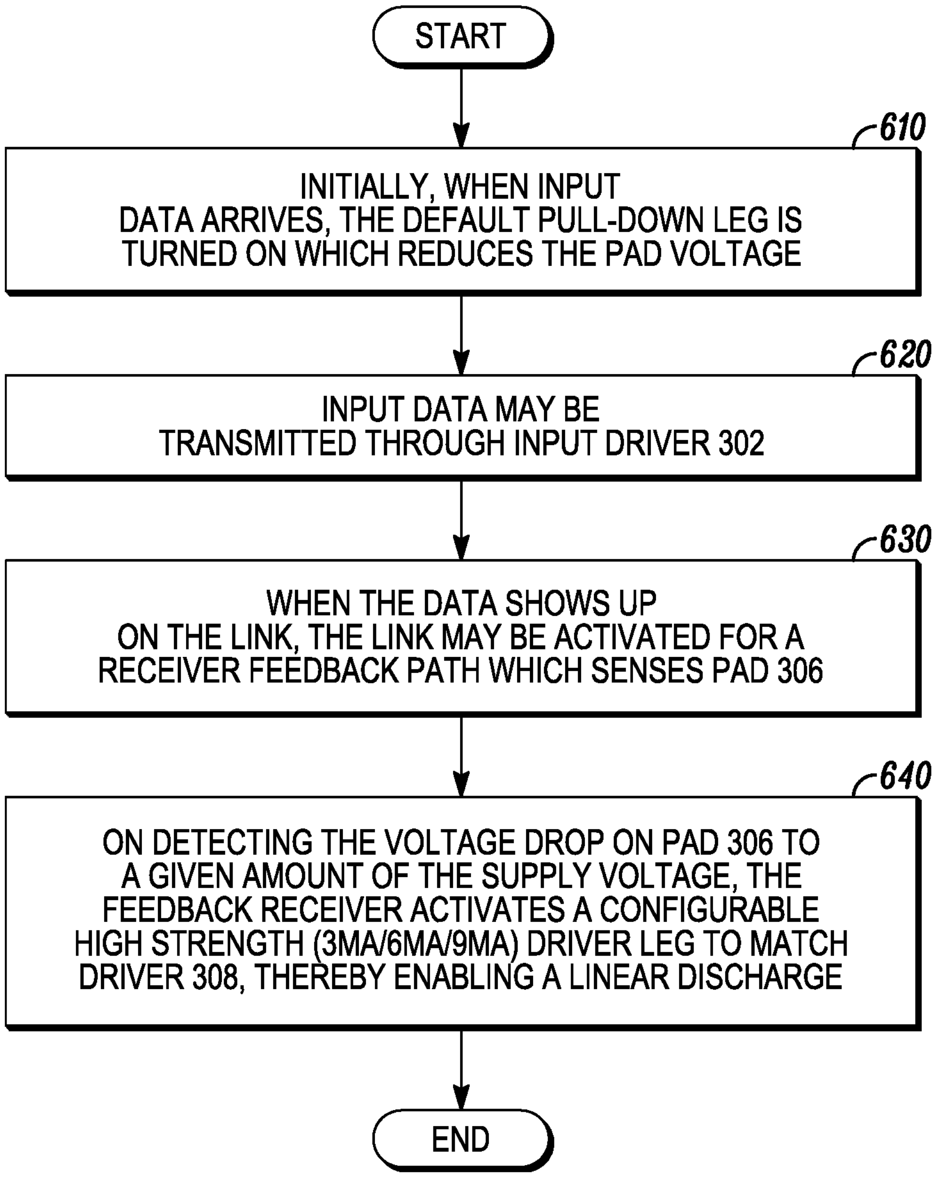

FIG. 6 is a flow diagram of an example process for controlling the fall time in a supply independent, delay control transmitter in accordance with some implementations. At 610, initially, when input data arrives, the default 0.5 mA pull-down leg is turned on which reduces the pad voltage. At 620, input data may be transmitted through 0.5 mA input driver 302. At 630, when the data shows up on the link, the link may be activated for a receiver feedback path which senses pad 306. At 640, on detecting the voltage drop on pad 306 to a given amount of the supply voltage, the feedback receiver may activate a configurable high strength (3 mA/6 mA/9 mA) driver leg to match driver 308, thereby enabling a linear discharge. As indicated above FIG. 6 is provided as an example. Other examples may differ from what is described in FIG. 6.

Figure 7:
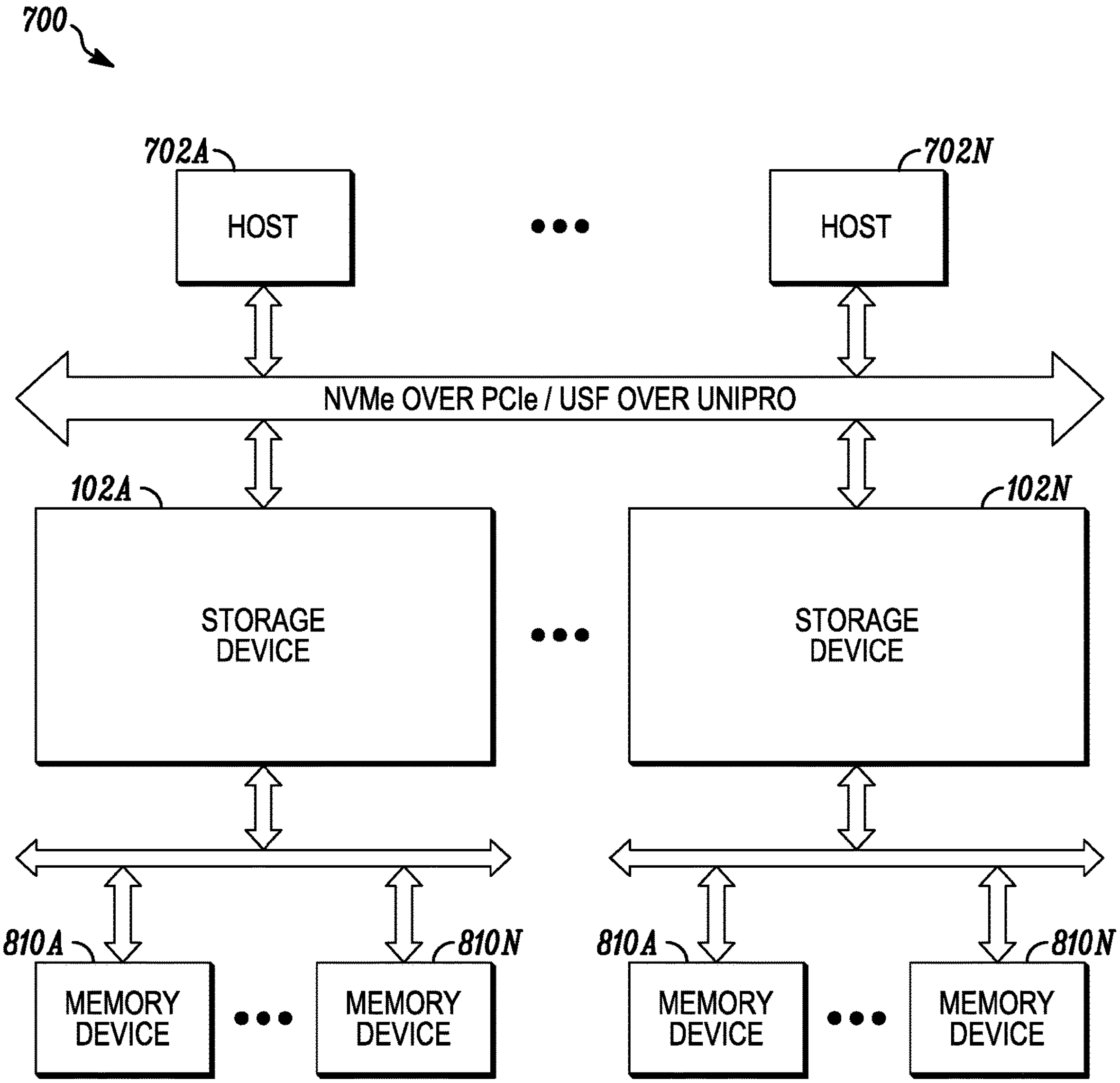

FIG. 7 is a diagram of an example environment in which systems and/or methods described herein are implemented. As shown in FIG. 7, Environment 700 may include hosts 702-702*n* (referred to herein as host(s) 702), and storage devices 102*a*-102*n* (referred to herein as storage device(s) 102). Hosts 702 and storage devices 102 may communicate via Non-Volatile Memory Express (NVMe) over peripheral component interconnect express (PCI Express or PCIe) standard, the Universal Flash Storage (UFS) over Unipro, or the like.

Devices of Environment 700 may interconnect via wired connections, wireless connections, or a combination of wired and wireless connections. For example, the network of FIG. 7 may include a cellular network (e.g., a long-term evolution (LTE) network, a code division multiple access (CDMA) network, a 3G network, a 4G network, a 5G network, another type of next-generation network, and/or the like), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 7 are provided as an example. In practice, there may be additional devices and/or networks, fewer devices and/or networks, different devices and/or networks, or differently arranged devices and/or networks than those shown in FIG. 7. Furthermore, two or more devices shown in FIG. 7 may be implemented within a single device, or a single device shown in FIG. 7 may be implemented as multiple, distributed devices. Additionally, or alternatively, a set of devices (e.g., one or more devices) of Environment 700 may perform one or more functions described as being performed by another set of devices of Environment 700.

Figure 8:
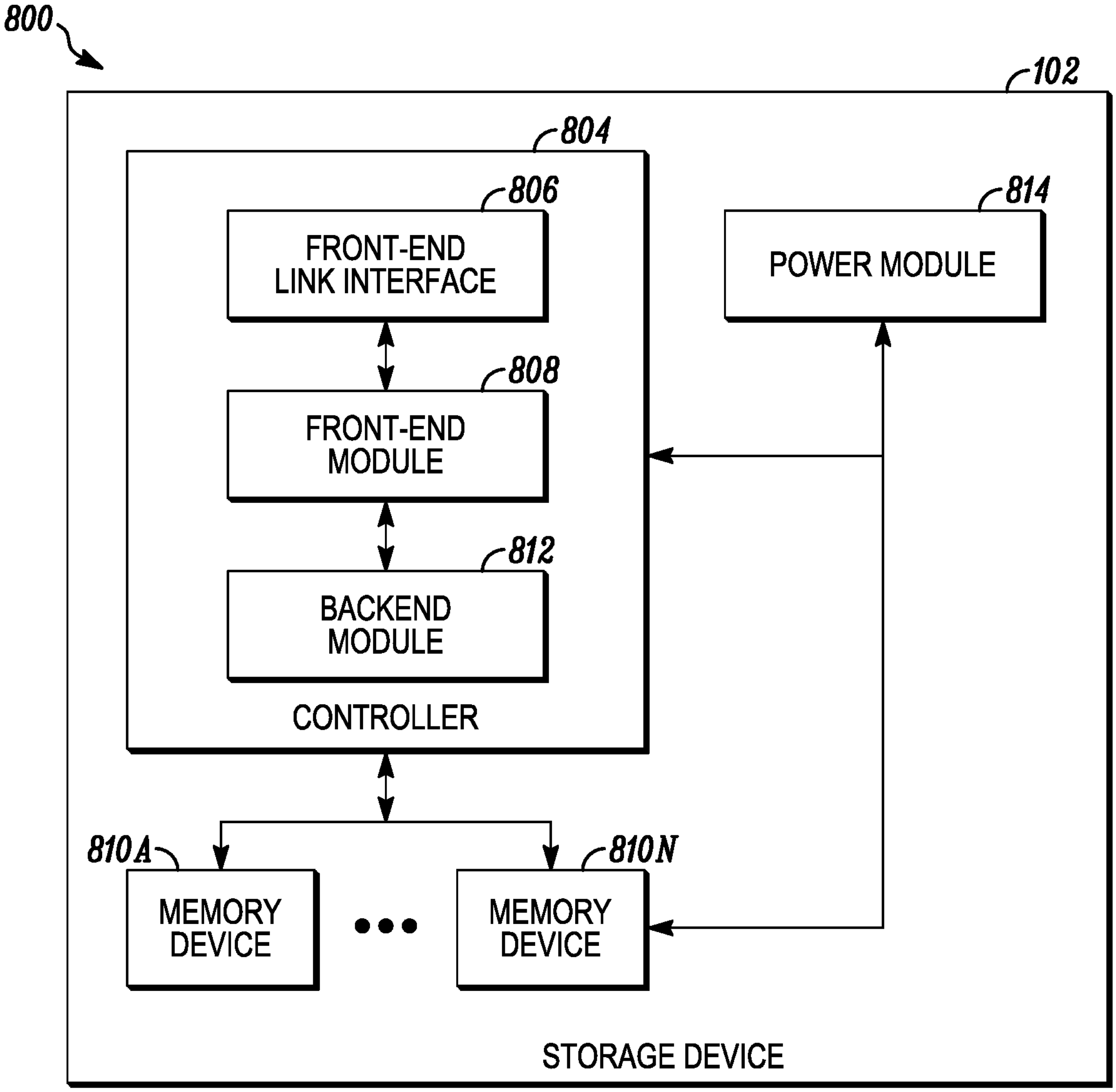

FIG. 8 is a diagram of example components of one or more devices of FIG. 1. Storage device 102 may include a controller 804 including a front-end link interface 806, a front-end module 808, and a back-end module 812. Storage device 102 may also include one or more memory devices 810*a*-810*n* (referred to herein as memory device(s) 810) and a power module 814. Storage device 102 may be, for example, a solid-state drive (SSD), and the like. Memory device 810 may be flash based, including, for example, NAND flash memory. Memory device 810 may be included in storage device 102 or may be otherwise communicatively coupled to storage device 102.

Controller 804 may execute background operations to manage resources on memory device 810. Controller 804 may also execute foreground operations to process instructions transmitted from a host (not shown). For example, controller 804 may read data from and/or write data to memory device 810 based on instructions received from the host. Storage device 102 may interface with the host through front-end link interface 806 according to one or more protocols. Storage device 802 may use front-end module 808 to receive and process instructions and data from the host and to send responses to the host. Storage device 102 may interface with memory 810 using back-end module 812. Back-end module 812 may include a flash translation layer and may maintain mapping tables for mapping physical addresses on memory device 810 to logical addresses provided by the host for data written to and/or read from memory device 810.

Storage device 102 may perform these processes based on a processor, for example, controller 804 executing software instructions stored by a non-transitory computer-readable medium, such as storage component 810. As used herein, the term "computer-readable medium" refers to a non-transitory memory device. Software instructions may be read into storage component 810 from another computer-readable medium or from another device. When executed, software instructions stored in storage component 810 may cause controller 804 to perform one or more processes described herein. Additionally, or alternatively, hardware circuitry may be used in place of or in combination with software instructions to perform one or more processes described herein. Thus, implementations described herein are not limited to any specific combination of hardware circuitry and software. System 800 may include additional components (not shown in this figure for the sake of simplicity).

The number and arrangement of components shown in FIG. 8 are provided as an example. In practice, device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

The foregoing disclosure provides illustrative and descriptive implementations but is not intended to be exhaustive or to limit the implementations to the precise form disclosed herein. One of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of present teachings.

As used herein, the term "component" is intended to be broadly construed as hardware, firmware, and/or a combination of hardware and software. It will be apparent that systems and/or methods described herein may be implemented in different forms of hardware, firmware, and/or a combination of hardware and software.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items (e.g., related items, unrelated items, a combination of related items, unrelated items, and/or the like), and may be used interchangeably with "one or more." The term "only one" or similar language is used where only one item is intended. Further, the phrase "based on" is intended to mean "based, at least in part, on" unless explicitly stated otherwise.

Moreover, in this document, relational terms such as first and second, top and bottom, and the like, may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", or "contains . . . a" does not, without more constraints, preclude the existence of additional identical elements in the process, method, article, or apparatus that comprises, has, includes, contains the element. The terms "substantially", "essentially", "approximately", "about" or any other version thereof, are defined as being close to as understood by one of ordinary skill in the art, and in one non-limiting implementation, the term is defined to be within 10%, in another implementation within 5%, in another implementation within 1% and in another implementation within 0.5%. The term "coupled" as used herein is defined as connected, although not necessarily directly and not necessarily mechanically. A device or structure that is "configured" in a certain way is configured in at least that way but may also be configured in ways that are not listed.

We claim:

1. A transmitter controls a fall time on an open-drain link including multiple components, the transmitter comprises:

an input driver to receive data and transmit the data on the open-drain link, thereby activating the open-drain link; and a feedback mechanism to keep track of a pad when the open-drain link is activated and when the pad reaches a predetermined amount of a supply voltage, the feedback mechanism triggers an appropriate main pull-down driver to control the fall time, wherein the feedback mechanism is a Schmitt trigger circuitry.

2. The transmitter of claim 1, wherein the input driver is a 0.5 mA driver.

3. The transmitter of claim 1, wherein the feedback mechanism uses about 50 micro amp (uA) of static current.

4. The transmitter of claim 1, wherein when the pad reaches the predetermined amount of the supply voltage, the feedback mechanism sends a trigger to a pre-driver to trigger the appropriate main pull-down driver to control the fall time.

5. The transmitter of claim 1, wherein the predetermined amount of the supply voltage is 0.4 of the supply voltage.

6. The transmitter of claim 1, wherein the supply voltage is one of 1.8 volts and 3.3 volts.

7. The transmitter of claim 1, wherein the main pull-down driver is a 3 milli ampere (mA), 6 mA, and 9 mA driver.

8. The transmitter of claim 1, wherein when input data arrives, a 0.5 mA pull-down leg is turned on which reduces the pad voltage.

9. The transmitter of claim 1, wherein the transmitter is independent of the supply voltage.

10. The transmitter of claim 1, wherein the pad is discharged through a 1.5 KΩ poly linear resistor.

11. The transmitter of claim 1, wherein the open-drain link connects a storage device to multiple devices.

12. A method in a transmitter for controlling a fall time on an open-drain link including multiple components, the method comprises:

transmitting, by an input driver, data on the open-drain link through an input driver;

activating, by the an input driver, the open-drain link;

tracking, by a feedback mechanism, voltage of a pad on the activated open-drain line; and triggering, by the feedback mechanism, an appropriate main pull-down driver to control the fall time when the pad reaches a predetermined amount of a supply voltage, wherein the feedback mechanism is a Schmitt trigger circuitry.

13. A transmitter for controlling a fall time on an open-drain link including multiple components, the transmitter comprising:

an input driver to receive data and transmit the data on the open-drain link, thereby activating the open-drain link;

a feedback mechanism to keep track of a pad when the open-drain link is activated and determine when the pad reaches a predetermined amount of a supply voltage;

a pre-driver to receive a trigger from the feedback mechanism; and a main pull-down driver to receive the trigger from the pre-driver to trigger an appropriate leg of the main pull-down driver and control the fall time, wherein the feedback mechanism is a Schmitt trigger circuitry.

* * * * *